United States Patent
Parikh (10) Patent No.: US 9,331,677 B2
(45) Date of Patent: May 3, 2016

(54) OSCILLATOR WITH ADJUSTABLE FREQUENCY

(71) Applicant: FUJITSU LIMITED, Kawasaki-shi, Kanagawa (JP)

(72) Inventor: Samir Parikh, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 31 days.

(21) Appl. No.: 14/188,437

(22) Filed: Feb. 24, 2014

(65) Prior Publication Data

US 2015/0244354 A1 Aug. 27, 2015

(51) Int. Cl.
*H03K 3/03* (2006.01)
*H03K 5/1252* (2006.01)
*H03L 7/099* (2006.01)

(52) U.S. Cl.
CPC ............ *H03K 3/0315* (2013.01); *H03K 5/1252* (2013.01); *H03L 7/099* (2013.01)

(58) Field of Classification Search
CPC .............................. H03K 3/0315; H03L 7/099

USPC ............................................... 331/16, 57, 179
See application file for complete search history.

(56) References Cited

U.S. PATENT DOCUMENTS 6,396,358 B1 * 5/2002 Poss et al. ..................... 331/57
7,554,413 B2 * 6/2009 Kim ............................... 331/16

OTHER PUBLICATIONS

E. Alon, et al "Replica Compensated Linear Regulators for Supply Regulated Phase-Locked Loops" JSSC, vol. 41, No. 2, pp. 413-425, Feb. 2006.

* cited by examiner

*Primary Examiner* — Arnold Kinkead
(74) *Attorney, Agent, or Firm* — Maschoff Brennnan (57) ABSTRACT

A circuit may include a delay element, a voltage adjust line, and a controllable capacitance. The delay element may have a delay and may include an input and an output. The input may be coupled to the output. The voltage adjust line may be configured to provide an adjusting voltage to the delay element to adjust the delay of the delay element. The controllable capacitance may be coupled to the output of the delay element and may be configured such that a change of the controllable capacitance adjusts the delay of the delay element.

18 Claims, 8 Drawing Sheets

OSCILLATOR WITH ADJUSTABLE FREQUENCY

FIELD

The embodiments discussed herein are related to oscillators.

BACKGROUND

Oscillators or oscillation circuits may be configured to generate signals at a particular frequency for a variety of different types of purposes. Various types of oscillators exist, including ring oscillators, LC tank oscillators, crystal oscillators, among other types of oscillators. Some types of oscillators, such as ring oscillators and LC tank oscillators, may be adjusted to generate a signal with a particular frequency. One problem encountered by oscillators is the introduction of noise into the generated signals by adjusting signals or other factors in circuits surrounding the oscillators.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a delay element, a voltage adjust line, and a controllable capacitance. The delay element may have a delay and may include an input and an output. The input may be coupled to the output. The voltage adjust line may be configured to provide an adjusting voltage to the delay element to adjust the delay of the delay element. The controllable capacitance may be coupled to the output of the delay element and may be configured such that a change of the controllable capacitance adjusts the delay of the delay element.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a ring oscillator is disclosed that includes a voltage adjust line and multiple stages. The voltage adjust line may be configured to provide an adjusting voltage to each of the multiple stages. The multiple stages may be configured to generate an output signal at a frequency. To generate the output signal, the multiple stages may be coupled such that an output of each of the stages is coupled to an input of another one of the stages. In some embodiments, each of the multiple stages may include a delay element having a delay. The delay element of each multiple stage may be configured such that the adjusting voltage on the voltage adjust line may adjust the delay of the delay element. Each of the multiple stages may also include a controllable capacitance coupled to an output of the delay element. In these and other embodiments, a change of the controllable capacitance may adjust the delay of the delay element. The frequency of the output signal may be based on the delay of the delay elements of the multiple stages. Thus, the frequency of the output signal may be adjusted by adjusting the adjusting voltage and/or the controllable capacitance of each of the multiple stages.

In some embodiments, the controllable capacitance may be used as a coarse-adjusting mechanism that adjusts the frequency of the output signal to a particular frequency within a particular frequency range of operation. The adjusting voltage may then be used to adjust the frequency of the output signal to a particular frequency within the particular frequency range of operation. As a result, an adjusting voltage gain of the ring oscillator, e.g., a change in frequency per change in voltage of the adjusting voltage, may be reduced as compared to other ring oscillators with similar frequency ranges of operation that are controlled using only an adjusting voltage. With the gain of the adjusting voltage reduced, noise input into the ring oscillator because of the adjusting voltage may also be reduced. As a result, the frequency of the output signal may be more consistent and stable as compared to frequencies of output signals from other ring oscillators with a similar frequency range of operation that are controlled using only an adjusting voltage.

Embodiments of the present invention will be explained with reference to the accompanying drawings.

Figure 1:
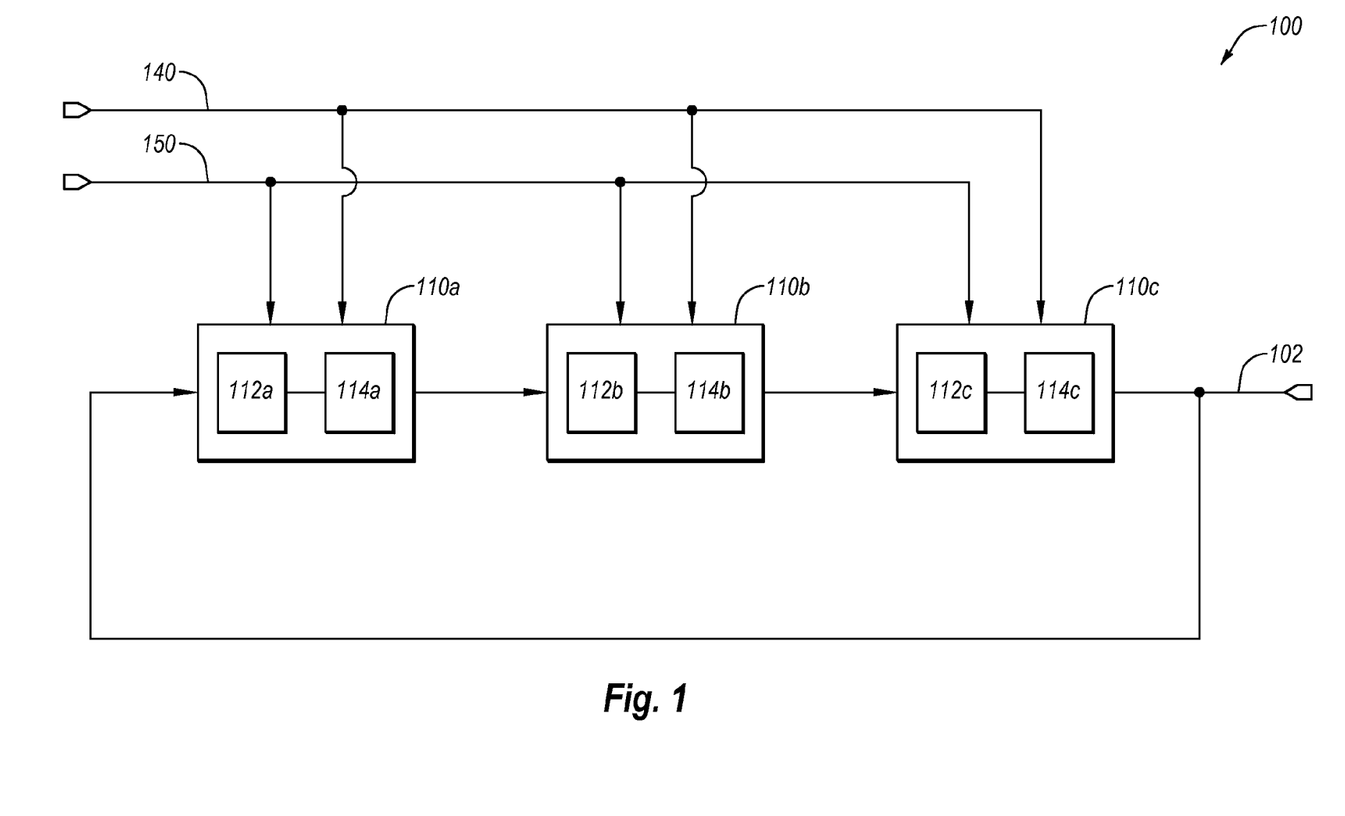
FIG. 1 is a diagram of an example ring oscillator.

FIG. 1 is a diagram of an example ring oscillator 100, arranged in accordance with at least one embodiment described herein. The ring oscillator 100 may be configured to generate an output signal 102 at a particular frequency. To generate the output signal 102, the ring oscillator 100 may include first, second, and third stages 110a, 110b, and 110c, referred to herein collectively as the stages 110. The stages 110 may be coupled such that an input of each of the stages 110 is coupled to an output of another of the stages 110 to form a ring. In particular, the input of the first stage 110a may be coupled to the output of the third stage 110c. The input of the second stage 110b may be coupled to the output of the first stage 110a and the input of the third stage 110c may be coupled to the output of the second stage 110b. Although FIG. 1 illustrates three stages 110, the ring oscillator 100 may have any number of stages. For example, the ring oscillator 100 may have 5, 10, 30, 100, 1000, 2000, or more stages 110. The number of stages 110 of the ring oscillator 100 may be based on one or more desired characteristics of the ring oscillator 100, such as a particular frequency of the output signal 102 of the ring oscillator 100, among other characteristics of the ring oscillator 100.

With the stages 110 coupled together to form a ring, a signal introduced into one of the stages 110, either by noise or some other source, may be amplified and delayed by each of the stages 110 to generate the output signal 102. The output signal 102 may be amplified and feedback through the stages 110 until the stages 110 are saturated and the output signal 102 stabilizes at a frequency.

Each of the stages 110 may include a delay element 112 and a controllable capacitance 114 coupled to an output of the delay element 112. For example, the first stage 110a may include a first delay element 112a and a first controllable capacitance 114a coupled to an output of the first delay element 112a. The second stage 110b may include a second delay element 112b and a second controllable capacitance 114b coupled to an output of the second delay element 112b. The third stage 110c may include a third delay element 112c and a third controllable capacitance 114c coupled to an output of the third delay element 112c.

The delay elements 112 may each be configured to delay a signal introduced into the ring oscillator 100, such that the delays result in the generation of the output signal 102. The delay of the delay elements 112 may be approximately equal or equal. An amount of the delay of the delay elements 112 and the number of the delay elements 112 may assist in determining a frequency of the output signal 102. For example, in some embodiments, the frequency of the output signal 102 may be determined based on the following equation:

$$F = \frac{1}{n \times T}$$

where F is the frequency of the output signal 102, n is the number of delay elements 112 and T is the delay of each delay element 112. The frequency of the output signal 102 may thus be adjusted by adjusting the delay of the delay elements 112. In some embodiments, the delay of the delay elements 112 may be adjusted by adjusting a voltage applied to the delay elements 112.

The controllable capacitances 114 may also be configured to adjust the delays of the delay elements 112. For example, when the controllable capacitances 114 are adjusted to have more capacitance, the delays of the delay elements 112 may increase. Alternately, when the controllable capacitances 114 are adjusted to have less capacitance, the delays of the delay elements 112 may decrease.

The ring oscillator 100 may also include a voltage adjust line 140 and a capacitance adjust line 150. Both the voltage adjust line 140 and the capacitance adjust line 150 may be coupled to each of the stages 110. The voltage adjust line 140 may be configured to provide an adjusting voltage to each of the stages 110. In particular, the voltage adjust line 140 may be configured to provide the adjusting voltage to each of the delay elements 112 to adjust the delay of each of the delay elements 112.

The capacitance adjust line 150 may be configured to provide a capacitance adjust signal to each of the stages 110. In particular, the capacitance adjust line 150 may be configured to provide the capacitance adjust signal to each of the controllable capacitances 114 to adjust an amount of capacitance coupled to the outputs of the delay elements 112 and thus adjust the delays of the delay elements 112. As a result, the delays of the delay elements 112, and thus the frequency of the output signal 102, may be adjustable using either or both of the adjusting voltage and the capacitance adjust signal.

In some embodiments, the adjusting voltage may provide a fine-adjusting of the delay of the delay elements 112 and the capacitance adjust signal may provide a coarse-adjusting of the delay of the delay elements 112. A coarse-adjusting of the delay of the delay elements 112 may indicate that a granularity of the change of the delay or an amount of change of the delay between two adjacent settings of the capacitance adjust signal may be larger than a granularity of the change or an amount of the change of the delay between two adjacent settings of the adjusting voltage.

Modifications, additions, or omissions may be made to the ring oscillator 100 without departing from the scope of the present disclosure. For example, in some embodiments, the ring oscillator 100 may include a controller configured to provide the adjusting voltage and the controllable capacitance.

Figure 2:
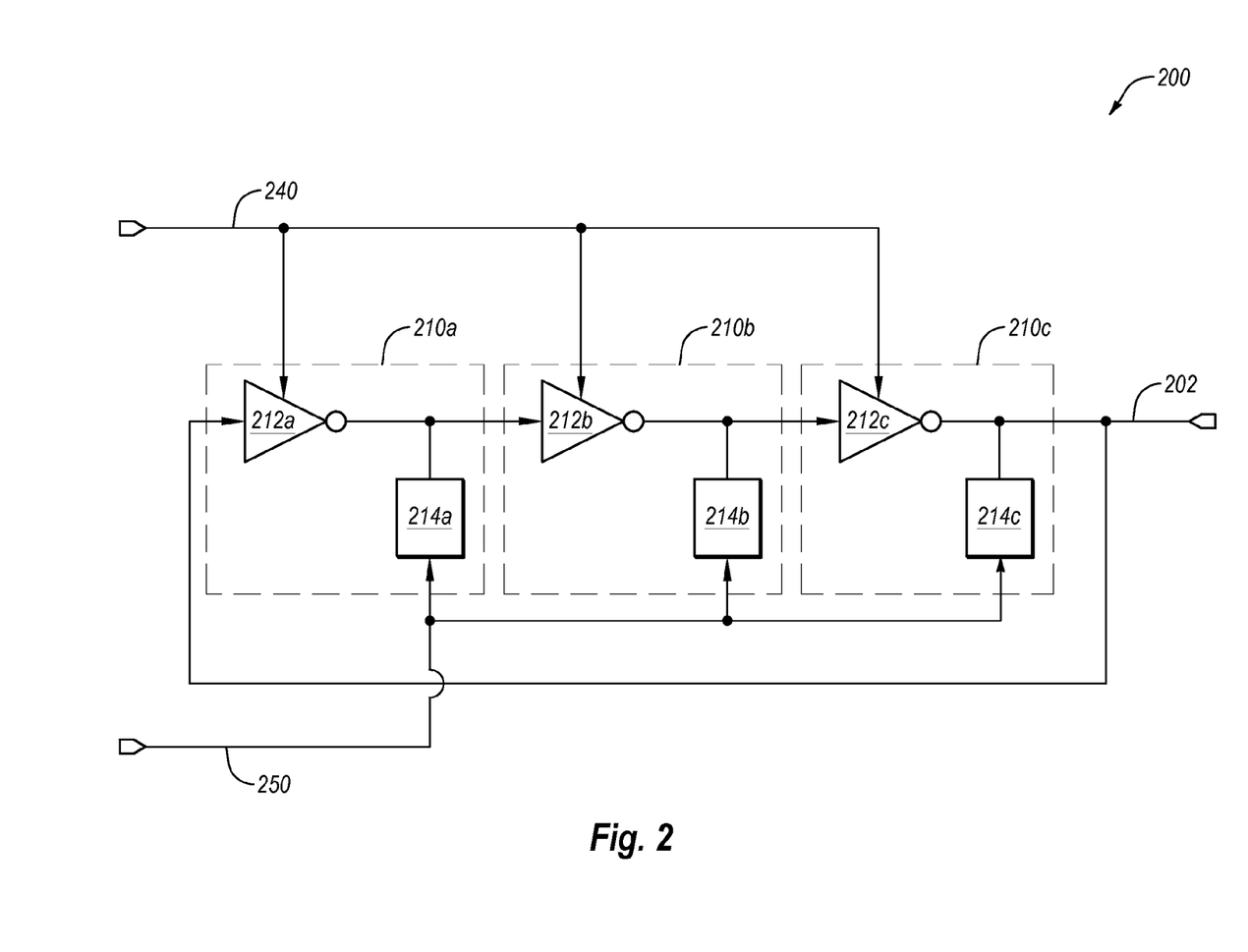
FIG. 2 is a diagram of another example ring oscillator.

FIG. 2 is a diagram of another example ring oscillator 200, arranged in accordance with at least one embodiment described herein. The ring oscillator 200 may be configured to generate an output signal 202 at a particular frequency. To generate the output signal 202, the ring oscillator 200 may include first, second, and third stages 210a, 210b, and 210c, referred to herein collectively as the stages 210. The stages 210 may be coupled in a ring configuration in an analogous manner as the stages 110 of FIG. 1 are coupled in a ring configuration.

Each of the stages 210 may include an inverter 212 and a controllable capacitance 214 coupled to an output of the inverter 212. For example, the first stage 210a may include a first inverter 212a and a first controllable capacitance 214a coupled to an output of the first inverter 212a. The second stage 210b may include a second inverter 212b and a second controllable capacitance 214b coupled to an output of the second inverter 212b. The third stage 210c may include a third inverter 212c and a third controllable capacitance 214c coupled to an output of the third inverter 212c.

The inverters 212 may each be configured to invert a signal received at their inputs. Additionally, the inverters 212 may each be configured to delay a signal received at their input. Because the stages 210 and thus the inverters 212 are configured in a ring configuration, the inverters 212 may continually invert and amplify a signal introduced into the stages 210 until the inverters 212 are saturated. As the inverters 212 saturate, the signal amplified by the inverters 212, which becomes the output signal 202, may stabilize. Because of the delay in the inverters 212, the output signal 202 may be an oscillating signal with a duty cycle that is approximately equal to or equal to 50%. The frequency of the output signal 202 may be based on the delay of the inverters 212 as described above.

Each of the inverters 212 may be coupled to a voltage adjust line 240. The voltage adjust line 240 may be configured to provide an adjusting voltage to the inverters 212. Changing the adjusting voltage provided to the inverters 212 may adjust the delays of the inverters 212. For example, increasing the adjusting voltage may decrease the delays of the inverters 212 and decreasing the adjusting voltage may increase the delays of the inverters 212.

The controllable capacitances 214 coupled to the outputs of the inverters 212 may also affect the delays of the inverters 212. For example, increasing the capacitance at the outputs of the inverters 212 may increase the delays of the inverters 212 while decreasing the capacitance at the outputs of the inverters 212 may decrease the delays of the inverters 212.

Each of the controllable capacitances 214 may be coupled to a capacitance adjust line 250. The capacitance adjust line 250 may be configured to provide a capacitance adjust signal to the controllable capacitances 214. The amount of capacitance coupled to outputs of the inverters 212 by the controllable capacitances 214 may be controlled by the capacitance adjust signal. In some embodiments, each of the controllable capacitances 214 may be a switched array of capacitors. In these and other embodiments, the capacitors in each of the switched arrays may all have the same or similar capacitances or different capacitances. Alternately or additionally, the controllable capacitances 214 may each be a variable capacitance, such as a voltage controlled varactor or digital varactor.

Modifications, additions, or omissions may be made to the ring oscillator 200 without departing from the scope of the present disclosure. For example, in some embodiments, the ring oscillator 200 may include a controller configured to provide the adjusting voltage and the controllable capacitance. Alternately or additionally, as noted, the ring oscillator 200 may include multiple other stages.

Figure 3:
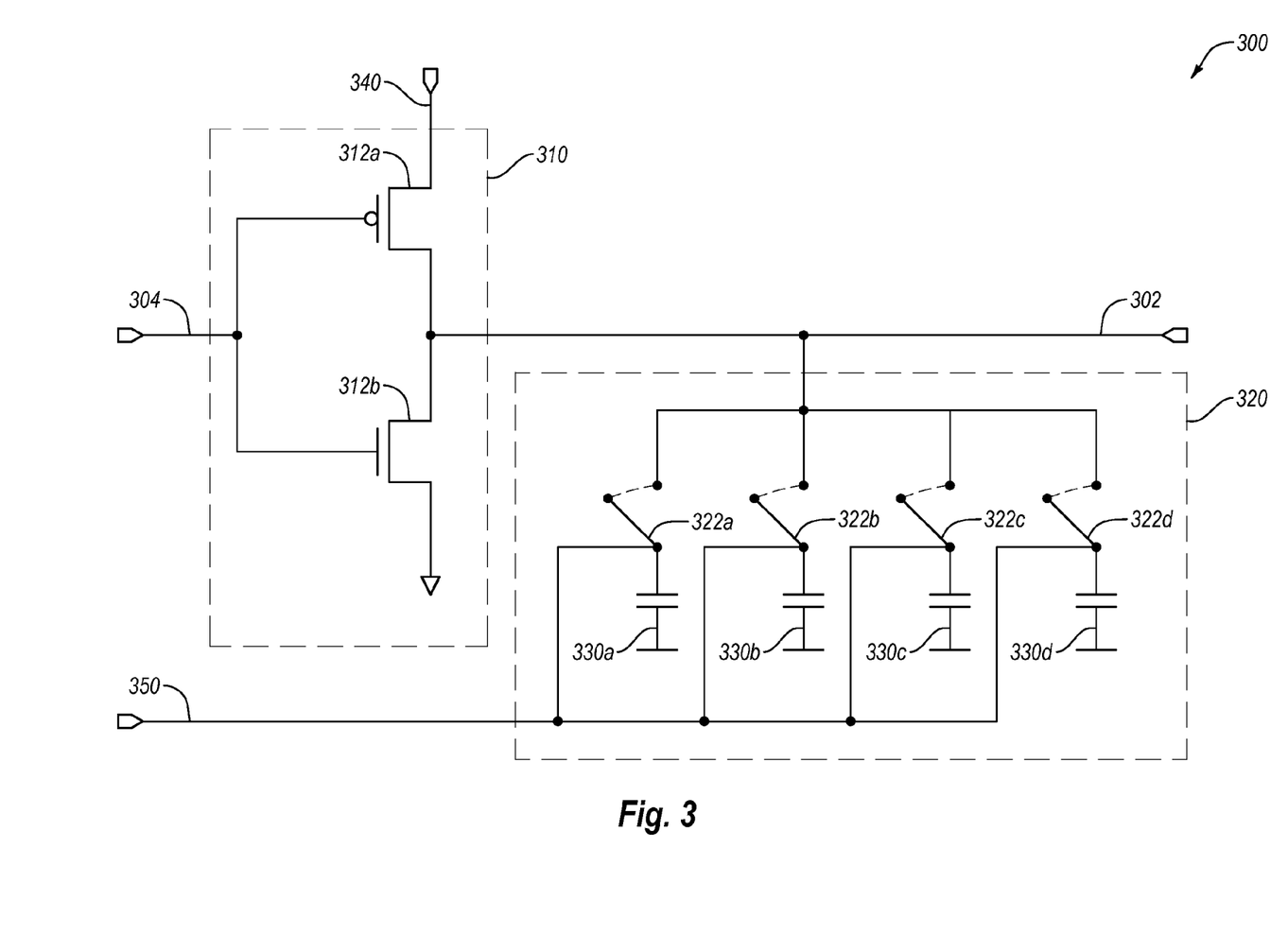
FIG. 3 is a diagram of an example stage in a ring oscillator.

FIG. 3 is a diagram of an example stage 300 in a ring oscillator, arranged in accordance with at least one embodiment described herein. The stage 300 may include an inverter 310 and a controllable capacitance 320. The stage 300 may be coupled in a ring with one or more similarly configured stages to form a ring oscillator, such as the ring oscillators 100 or 200 of FIGS. 1 and 2.

The inverter 310 includes an input node 304, an output node 302, and a voltage node 340. The inverter 310 further includes a p-type transistor 312a and an n-type transistor 312b, referred to herein collectively as the transistors 312. Each of the transistors 312 includes a gate, a drain, and a source. The gates of the transistors 312 are coupled to the input node 304. The drains of the transistors 312 are coupled to the output node 302. The source of the p-type transistor 312a is coupled to the voltage node 340. The source of the n-type transistor 312b is coupled to ground.

The controllable capacitance 320 is coupled to the output node 302 of the inverter 310. The controllable capacitance 320 includes first, second, third, and fourth switches 322a, 322b, 322c, and 322d, referred to herein collectively as the switches 322. The controllable capacitance 320 further includes first, second, third, and fourth capacitors 330a, 330b, 330c, and 330d, referred to herein collectively as the capacitors 330. Each of the switches 322 is coupled between the output node 302 of the inverter 310 and one of the capacitors 330 as illustrated in FIG. 3. The capacitors 330 are coupled between the switches 322 and ground. Each of the switches 322 is coupled to a capacitance adjust line 350 configured to provide a capacitance adjust signal to each of the switches 322. The capacitance adjust signal may open or close the switches 322 to couple one or more of the capacitors 330 to the output node 302 to adjust the capacitance at the output node 302. In some embodiments, the switches 322 may be transistors, some other type of switch, or some combination of types of switches.

The capacitors 330 may each have an equal or approximately equal capacitance. Alternately or additionally, the capacitors 330 may each have a different capacitance or one or more of the capacitors 330 may have different or the same capacitances. In some embodiments, the capacitors 330 may be configured such that the capacitors 330 each have a capacitance that increases by powers of two to allow capacitance to be coupled to the output node 302 using binary algorithms. For instance, the capacitance of the second capacitor 330b may be twice the capacitance of the first capacitor 330a, the capacitance of the second capacitor 330c may be twice the capacitance of the second capacitor 330b, and the capacitance of the fourth capacitor 330d may be twice the capacitance of the third capacitor 330c.

An example of the operation of the stage 300 follows. A signal may be received on the input node 304 and provided to the transistors 312. The transistors 312 may amplify and invert the signal. The transistors 312 may also delay the signal. The amount of the delay of the signal may be based on a rise and/or fall time of the transistors 312, which may be affected by a voltage applied to the voltage node 340. For example, a higher voltage applied to the voltage node 340 may decrease the delay of the signal while a lower voltage applied to the voltage node 340 may increase the delay of the signal.

The rise and/or fall time of the transistors 312 may also be affected by the capacitance at the output node 302. Increasing the capacitance at the output node 302 may increase the rise and/or fall time of the transistors 312, which may result in an increased delay of the signal. Decreasing the capacitance at the output node 302 may decrease the rise and/or fall time of the transistors 312, which may result in a decreased delay of the signal.

The frequency of oscillation of the signal may be based on the amount of the delay caused by the inverter 310. Thus, to increase the frequency of oscillation of the signal, the voltage at the voltage node 340 may be increased and/or the capacitance coupled to the output node 302 by the controllable capacitance 320 may be decreased by opening one or more of the switches 322. To decrease the frequency of oscillation of the signal, the voltage at the voltage node 340 may be decreased and/or the capacitance coupled to the output node 302 by the controllable capacitance 320 may be increased by closing one or more of the switches 322.

Modifications, additions, or omissions may be made to the stage 300 without departing from the scope of the present disclosure. For example, in some embodiments, the stage 300 may include more than four capacitors. The stage 300 may include 2, 6, 8, 12, 20, 50, 100, or more capacitors, or some other number of capacitors. Alternately or additionally, the inverter 310 may have a different configuration than that illustrated in FIG. 3.

Figure 4:
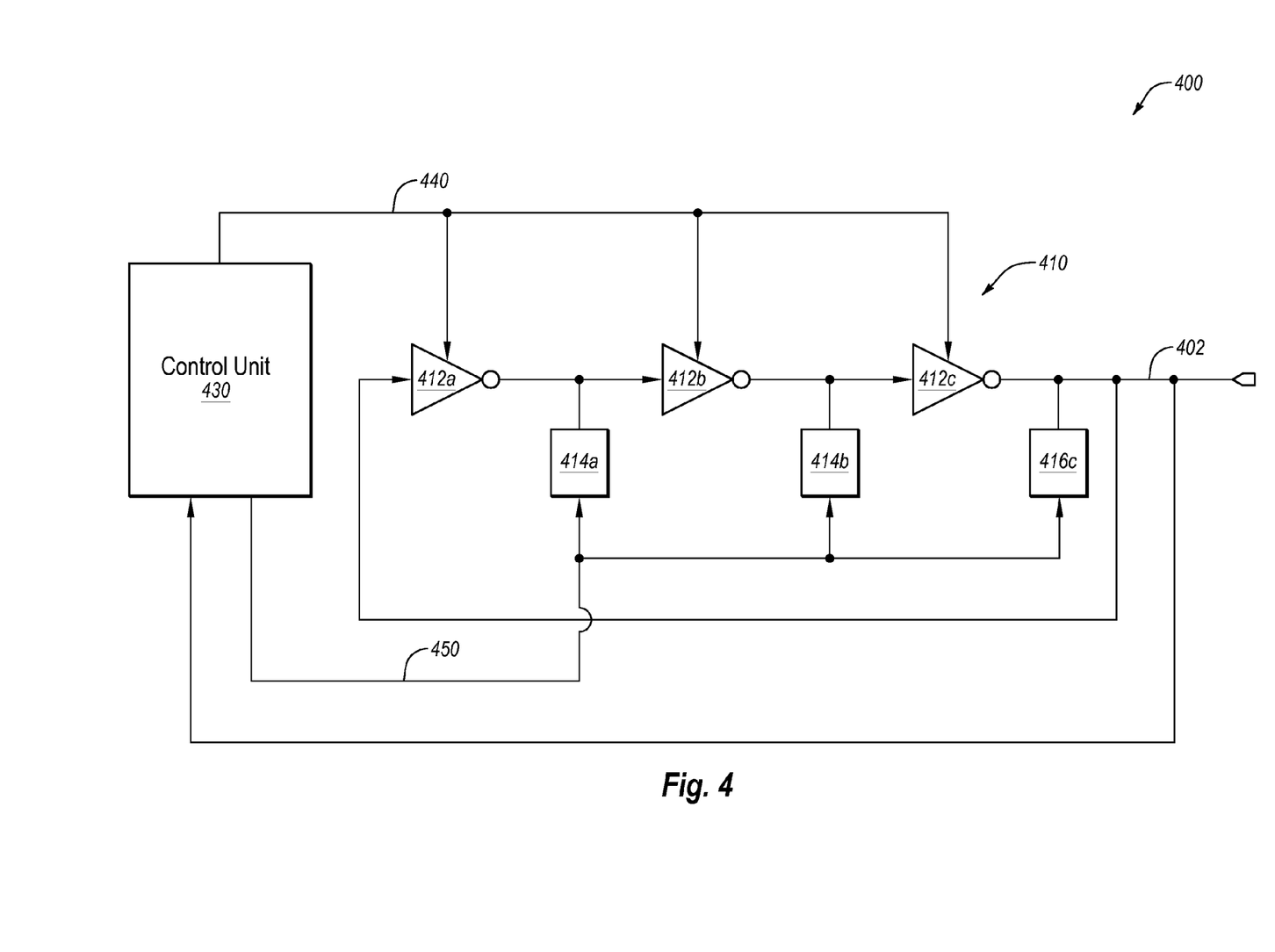
FIG. 4 is a diagram of an example circuit that includes a ring oscillator and a control unit.

FIG. 4 is a diagram of an example circuit 400 that includes a ring oscillator 410 and a control unit 430, arranged in accordance with at least one embodiment described herein. The ring oscillator 410 may be configured to generate an output signal 402. The ring oscillator 410 may include a first inverter 412a, a second inverter 412b, and a third inverter 412c, referred to herein collectively as the inverters 412. The inverters 412 may be configured in a ring configuration such that the input of each of the inverters 412 is coupled to an output of another of the inverters 412.

The ring oscillator 410 may further include a first controllable capacitance 414a, a second controllable capacitance 414b, and a third controllable capacitance 414c, referred to herein collectively as the controllable capacitances 414. The first controllable capacitance 414a may be coupled to an output of the first inverter 412a, the second controllable capacitance 414b may be coupled to an output of the second inverter 412b, and the third controllable capacitance 414c may be coupled to an output of the third inverter 412c. The ring oscillator 410 may function in an analogous manner as the ring oscillator 200 of FIG. 2.

A voltage adjust line 440 may communicatively couple the control unit 430 and the inverters 412. A capacitance adjust line 450 may communicatively couple the control unit 430 and the controllable capacitances 414.

The control unit 430 may be configured to generate an adjusting voltage that is provided to the inverters 412 along the voltage adjust line 440. The adjusting voltage may be configured to adjust a delay of the inverters 412. The control unit 430 may also be configured to generate a capacitance adjust signal that is provided to the controllable capacitance 414 along the capacitance adjust line 450. The capacitance adjust signal may be configured to adjust the capacitance of the controllable capacitances 414 and thereby adjust the delay of the inverters 412. By adjusting the delay of the inverters 412, the control unit 430 may be configured to adjust the frequency of the output signal 402.

In some embodiments, the control unit 430 may be configured to adjust the frequency of the output signal 402. To adjust the frequency of the output signal 402, the control unit 430 may be configured to adjust the adjusting voltage and the capacitance adjust signal. In some embodiments, the capacitance adjust signal may be used to coarsely adjust the frequency of the output signal 402 and the adjusting voltage may be used to finely adjust the frequency of the output signal 402. For example, the control unit 430 may be configured to use the capacitance adjust signal to select a frequency range of operation for the output signal 402 and to use the adjusting voltage to adjust the frequency of the output signal 402 to a particular frequency within the selected frequency range of operation. Frequency ranges of operation are further illustrated with respect to FIG. 6.

In some embodiments, the control unit 430 may adjust the capacitance adjust signal and the adjusting voltage to adjust the frequency of the output signal 402 to a particular frequency. In these and other embodiments, the control unit 430 may receive the output signal 402 and may detect a frequency of the output signal 402. Based on the detected frequency of the output signal 402, the control unit 430 may adjust the capacitance adjust signal and the adjusting voltage until the frequency of the output signal 402 is approximately equal or equal to the particular frequency.

In some embodiments, the control unit 430 may adjust the capacitance adjust signal and the adjusting voltage based on a difference between the frequency of the output signal 402 and a particular frequency. In these and other embodiments, the control unit 430 may adjust the capacitance adjust signal to adjust the selected frequency range of operation until the particular frequency is within the range of the selected frequency range of oscillation. The control unit 430 may then adjust the adjusting voltage until the frequency of the output signal 402 is approximately equal or equal to the particular frequency.

In some embodiments, the control unit 430 may adjust the capacitance adjust signal by incrementing or decrementing the capacitance adjust signal until the particular frequency is within the selected frequency range of operation. Alternately or additionally, the control unit 430 may adjust the capacitance adjust signal based on a bi-section control method to find the frequency range of operation that includes the particular frequency.

In some embodiments, after adjusting the capacitance adjust signal and the adjusting voltage such that the frequency of the output signal 402 is approximately equal or equal to the particular frequency, the control unit 430 may continue to monitor a difference between the frequency of the output signal 402 and the particular frequency. When the difference between the frequency of the output signal 402 and the particular frequency is larger than a threshold, the control unit 430 may adjust the capacitance adjust signal and/or the adjusting voltage. In these and other embodiments, the threshold may be zero or some other number.

In some embodiments, the control unit 430 may also be configured to switch between the selected frequency range of operation during operation of the ring oscillator 410 based on the location of the adjusting voltage within the range of the adjusting voltage. For example, the adjusting voltage may have a range between 0 and 1 volts (v). When the adjusting voltage is above 0.9 v or less than 0.1 v, the control unit 430 may adjust the selected frequency range of operation such that the adjusting voltage operates closer to a middle value of the range of the adjusting voltage. In these and other embodiments, the ranges of the frequency ranges of operation may overlap.

Modifications, additions, or omissions may be made to the circuit 400 without departing from the scope of the present disclosure. For example, in some embodiments, the control unit 430 may provide one of the adjusting voltage 440 or the capacitance adjust signal 450 and another circuit or component may provide the other of the adjusting voltage 440 or the capacitance adjust signal 450.

In some embodiments, the control unit 430 may include hardware that is configured to execute operations to cause the ring oscillator 410 to adjust the frequency of the output signal 402 as described herein. In these and other embodiments, the hardware may execute operations by executing instructions stored in memory or other computer-readable medium. Alternately or additionally, the hardware may be an application-specific integrated circuit (ASIC) or a field-programmable gate array (FPGA) that is configured to execute operations to cause the control unit 430 to perform the operations described herein. Alternately or additionally, the hardware may execute the operations using a combination of executions performed by an ASIC/FPGA, other hardware, and executions performed by instructions stored in memory.

The memory may be any computer-readable media as described herein. Such computer-readable media may be any available media that may be accessed by a general purpose, special purpose computer (e.g., a processor), or the hardware described. By way of example, and not limitation, such computer-readable media may include a non-transitory or tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, or any other storage medium which may be used to carry or store desired program code in the form of computer-executable instructions or data structures. Combinations of the above may also be included within the scope of computer-readable media.

Figure 5:
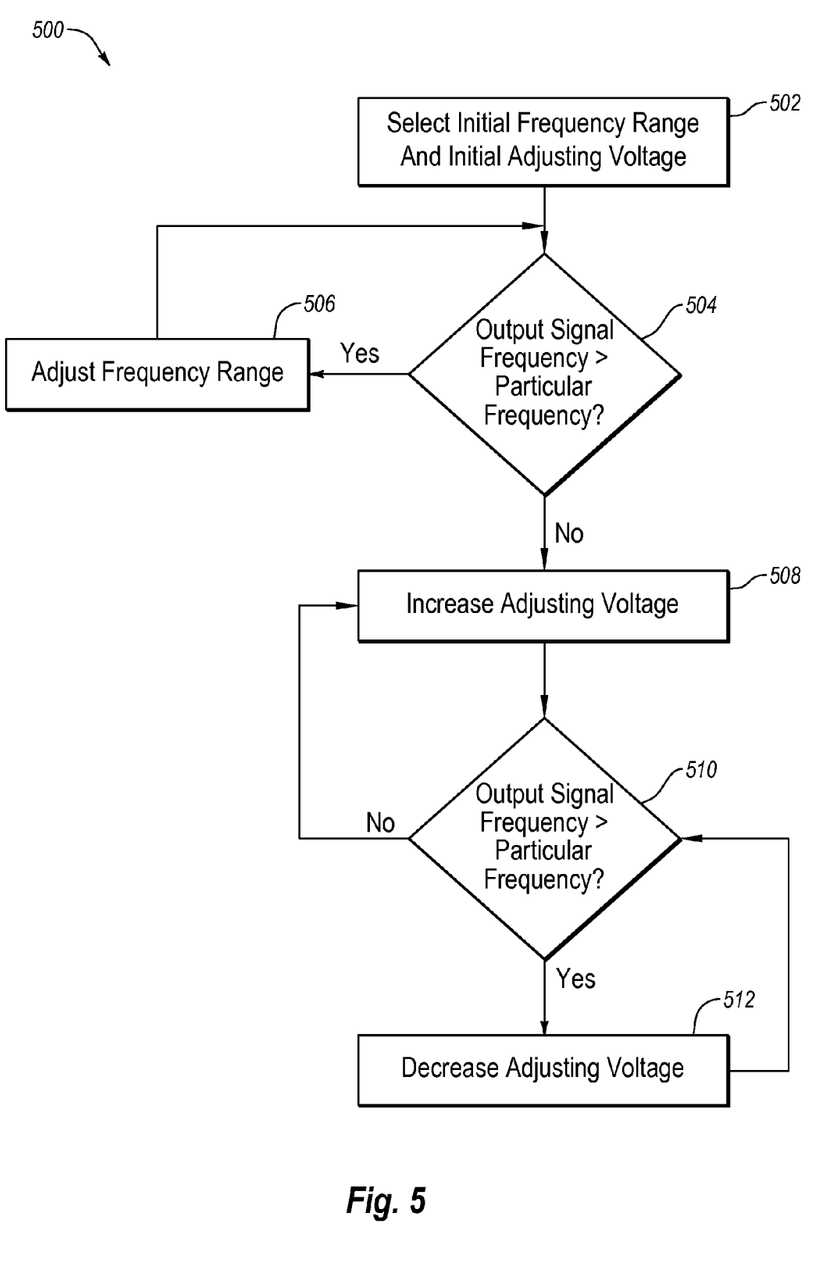
FIG. 5 is a flowchart of an example method of adjusting a frequency of a ring oscillator.

FIG. 5 is a flowchart of an example method 500 of adjusting a frequency of a ring oscillator, arranged in accordance with at least one embodiment described herein. The method 500 may be implemented, in some embodiments, by a circuit, such as the circuit 400 of FIG. 4. Although illustrated as discrete blocks, various blocks may be divided into additional blocks, combined into fewer blocks, or eliminated, depending on the desired implementation.

The method 500 may begin at block 502, where an initial frequency range and an initial adjusting voltage may be selected for the ring oscillator. The initial frequency range may be selected by adjusting controllable capacitance of the ring oscillator using a capacitance adjust signal. In some embodiments, the initial frequency range may be a highest frequency range. In these and other embodiments, a minimum amount of the controllable capacitance may be coupled into the ring oscillator. In some embodiments, the initial adjusting voltage may be middle voltage of a range of the adjusting voltage. The adjusting voltage may be provided to inverters within the ring oscillator. In these and other embodiments, the adjusting voltage may adjust a delay of the inverters. The initial frequency range and the initial adjusting voltage may cause the output signal to have a frequency.

In block 504, the frequency of the output signal may be compared with the frequency of a reference signal. When the frequency of the output signal is larger than the frequency of the reference signal, the method 500 may proceed to block

506. When the frequency of the output signal is less than the frequency of the reference signal, the method 500 may proceed to block 508.

In block 506, the frequency range of operation may be adjusted. The frequency range of operation may be adjusted by adjusting a capacitance adjust signal to cause an amount of capacitance coupled into the ring oscillator by the controllable capacitance to change. In some embodiments, the frequency range of operation may be adjusted to an adjacent frequency range of operation. In some embodiments, the frequency range of operation may be adjusted to an adjacent lower frequency range of operation by coupling more capacitance from the controllable capacitance into the ring oscillator. By adjusting to a lower frequency range of operation, the frequency of the output signal may be lower.

In block 508, the adjusting voltage may be increased. Increasing the adjusting voltage may cause the delay of inverters in the ring oscillator to decrease. Decreasing the delay of the inverters may increase the frequency of the output signal.

In block 510, a frequency of the output signal may be compared with the frequency of a reference signal. When the frequency of the output signal is larger than the frequency of the reference signal, the method 500 may proceed to block 512. When the frequency of the output signal is less than the frequency of the reference signal, the method 500 may proceed to block 508.

In block 512, the adjusting voltage may be decreased. Decreasing the adjusting voltage may cause the delay of the inverters in the ring oscillator to increase. Increasing the delay of the inverters may decrease the frequency of the output signal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, block 510 may further include determining when a difference between the frequency of the output signal and the particular frequency is larger than a threshold. In these and other embodiments, the method 500 may return to block 504.

Figure 6:
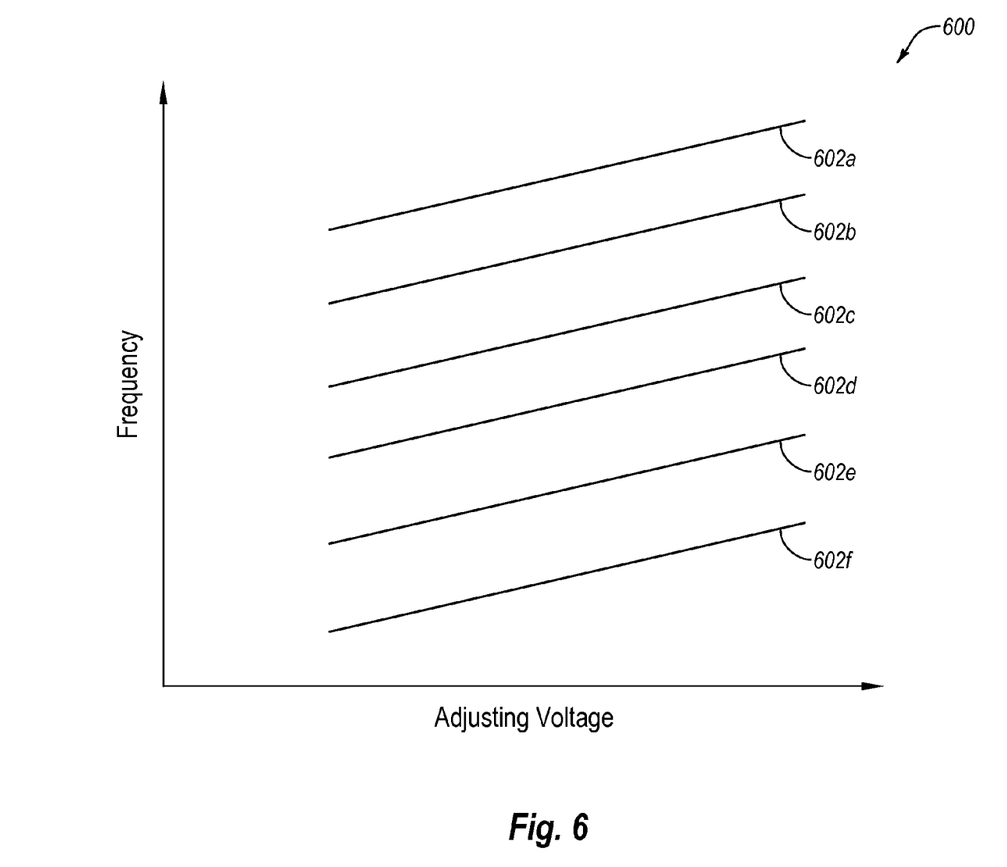
FIG. 6 is a graph of different frequency ranges of operation of an example ring oscillator.

FIG. 6 is a graph 600 of different frequency ranges of operation of an example ring oscillator, arranged in accordance with at least one embodiment described herein. The graph 600 illustrates first, second, third, fourth, fifth, andsixth frequency ranges of operation 602*a*-602*f*, referred to collectively herein as the frequency ranges of operation 602. The graph 600 illustrating six frequency ranges of operation 602 is not intended to be limiting. An example ring oscillator may have less or more than six frequency ranges of operation 602.

The y-axis of the graph 600 corresponds to a frequency of an output signal of a ring oscillator, such as a frequency of the output signal 102, 202, or 402 of FIGS. 1, 2, and 4. The x-axis of the graph 600 corresponds to a voltage of an adjusting voltage that may be applied to inverters within a ring oscillator, such as the delay elements 112 and/or the inverters 212 and 412 of FIGS. 1, 2, and 4, respectively.

As illustrated in FIG. 6, as the adjusting voltage increases, the frequency of the output signal increases and as the adjusting voltage decreases, the frequency of the output signal decreases for each of the six frequency ranges of operation 602. Thus, adjusting the adjusting voltage may allow the frequency of the output signal to be adjusted within a selected one of the frequency ranges of operation 602. Adjusting within the selected one of the frequency ranges of operation 602 may be referred to herein as fine-adjusting. In some embodiments, the fine-adjusting may be continuous or discrete within the frequencies in the selected one of the frequency ranges of operation 602.

To adjust the frequency of the output signal beyond the selected frequency range of operation 602, another frequency range of operation 602 may be selected. Adjusting between different ones of the frequency ranges of operation 602 may be referred to herein as coarse-adjusting. In these and other embodiments, coarse-adjusting may have larger frequency steps between adjacent selectable frequencies than fine-adjusting.

The frequency ranges of operation 602 may be configured to have some frequency overlap. For example, the highest frequency in the third frequency range of operation 602*c* may be higher than the lowest frequency in the second frequency range of operation 602*b*. By providing overlap between the frequency ranges of operation 602, the output signal may be adjusted to the frequencies between the lowest frequency in the sixth frequency range of operation 602*f* and the highest frequency in the first frequency range of operation 602*a*. In some embodiments, the frequency ranges of operation 602 may overlap such that every frequency may be selected from at least two different frequency ranges of operation 602.

Figure 7:
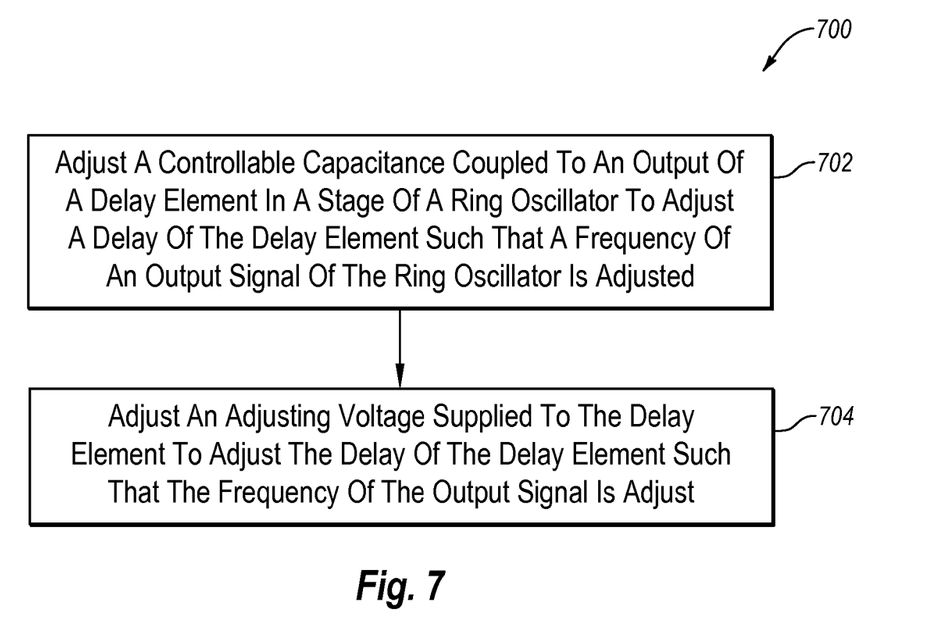
FIG. 7 is a flowchart of an example method of adjusting a frequency of a ring oscillator.

FIG. 7 is a flowchart of an example method 700 of adjusting a frequency of a ring oscillator, arranged in accordance with at least one embodiment described herein. The method 700 may be implemented, in some embodiments, by a circuit, such as the circuit 400 of FIG. 4. Although illustrated as discrete blocks, various blocks may be divided into additional blocks, combined into fewer blocks, or eliminated, depending on the desired implementation.

The method 700 may begin at block 702, where a controllable capacitance coupled to an output of a delay element in a stage of a ring oscillator may be adjusted to adjust a delay of the delay element such that a frequency of an output signal of the ring oscillator is adjusted. In some embodiments, adjusting the controllable capacitance may include selecting one or more capacitances to couple to the output of the delay element from a switched capacitance array. In some embodiments, increasing the controllable capacitance may increase the delay of the delay element such that the frequency of the output signal decreases.

In block 704, an adjusting voltage supplied to the delay element may be adjusted to adjust the delay of the delay element such that the frequency of the output signal is adjusted. In some embodiments, increasing the adjusting voltage may decrease the delay of the delay element such that the frequency of the output signal increases.

For example, the method 700 may further include selecting a frequency range of operation for the output signal from multiple frequency ranges of operation. In these and other embodiments, the controllable capacitance may be adjusted based on the selected frequency range of operation. The method 700 may further include selecting a particular frequency within the selected frequency range of operation. In these and other embodiments, the adjusting voltage may be adjusted based on the particular frequency.

Figure 8:
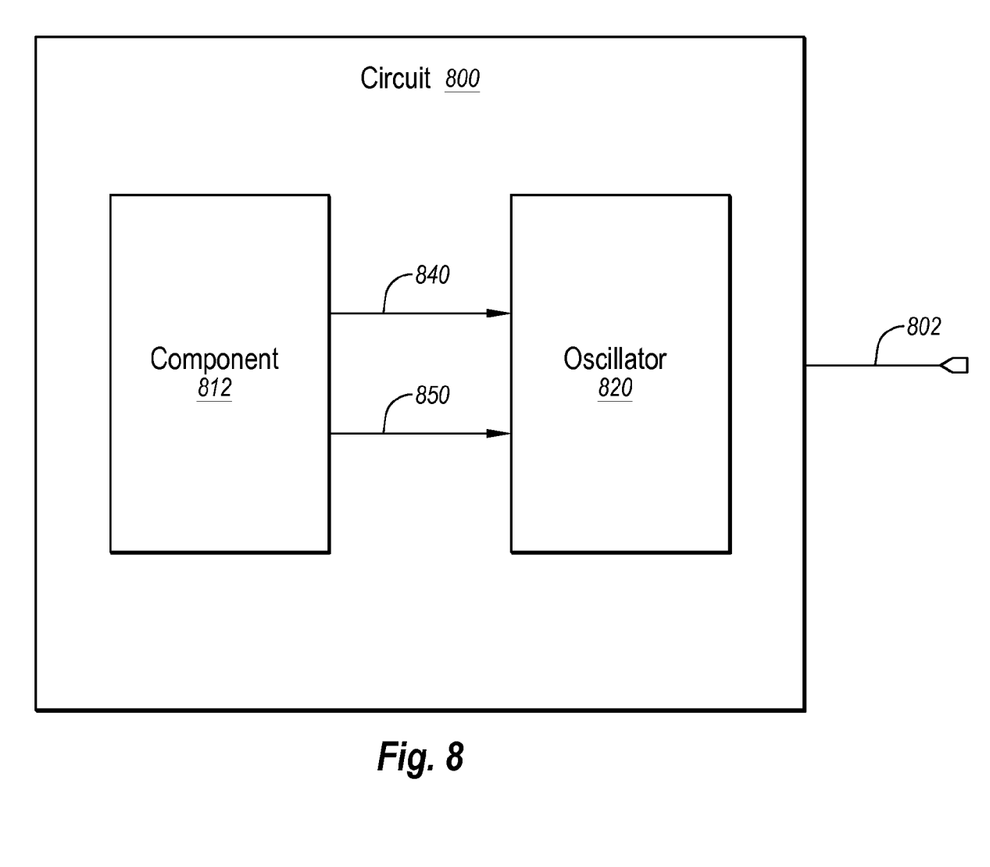
FIG. 8 is a diagram of a circuit that includes a ring oscillator.

FIG. 8 is a diagram of a circuit 800 that includes a ring oscillator 820, arranged in accordance with at least one embodiment described herein. The circuit 800 may also include a component 812 that is coupled to the ring oscillator 820. The component 812 may be configured to provide an adjusting voltage 840 and a capacitance adjust signal 850 to the ring oscillator 820. The ring oscillator 820 may be analogous to the ring oscillators 100, 200, and/or 410 of FIGS. 1 2, and 4, respectively. The ring oscillator 820 may be configured to output an output signal 802 with a frequency based on the adjusting voltage 840 and the capacitance adjust signal 850 provided by the component 812.

In some embodiments, the circuit 800 may be a phase-locked-loop (PLL) circuit. In these and other embodiments, the component 812 may include a phase detector, a charge pump, and a loop filter that may be configured to provide the adjusting voltage 840 based on a comparison between the frequency of the output signal 802 and a reference signal. The component 812 may also include additional logic and/or hardware that may be configured to provide the capacitance adjust signal 850.

In some embodiments, the circuit 800 may be a digital-locked-loop (DLL) circuit. In these and other embodiments, the component 812 may include a digital phase detector and digital loop filter that may be configured to provide the adjusting voltage 840 based on a comparison between the frequency of the output signal 802 and a reference signal. The component 812 may also include additional logic and/or hardware that may be configured to provide the capacitance adjust signal 850.

In some embodiments, the circuit 800 may be a clock and data recovery (CDR) circuit. In these and other embodiments, the component 812 may include circuitry to extract a clock signal from a data signal. In these and other embodiments, the adjusting voltage 840 may be based on the frequency of the clock signal extracted from the data signal. The component 812 may also include additional logic and/or hardware that may be configured to provide the capacitance adjust signal 850. Modifications, additions, or omissions may be made to the circuit 800 without departing from the scope of the present disclosure.

As used herein, the terms "module," "component," or "unit," may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the systems and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modules running on a computing system.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
    a delay element having a delay and including an input and an output, the input being coupled to the output;
    a voltage adjust line configured to provide an adjusting voltage to the delay element to provide fine-adjusting of the delay of the delay element; and
    a controllable capacitance coupled to the output of the delay element, the controllable capacitance configured such that a change of the controllable capacitance provides coarse-adjusting of the delay of the delay element,
    wherein the course-adjusting of the delay of the delay element by the controllable capacitance results in discrete delays with a first delay being between two adjacent discrete delays,
    the fine-adjusting of the delay of the delay element by the adjusting voltage results in a range of delays with a range greater than the first delay, and
    the change of the controllable capacitance is independently adjustable from a change in the adjusting voltage.

2. The circuit of claim 1, wherein the delay element comprises an inverter.

3. The circuit of claim 1, wherein the delay element comprises a first delay element, the circuit further comprising a plurality of second delay elements coupled between the output and the input of the first delay elements.

4. The circuit of claim 3, wherein the controllable capacitance comprises a first controllable capacitance, wherein the voltage adjust line is configured to provide the adjusting voltage to each of the plurality of second delay elements and an output of each of the second delay elements is coupled to one of a plurality of second controllable capacitances.

5. The circuit of claim 1, wherein the controllable capacitance comprises an array of switched capacitors, wherein each of the switched capacitors in the array is individually switched to add capacitance to or remove capacitance from the output of the delay element to thereby coarsely adjust the delay of the delay element.

6. The circuit of claim 1, wherein the delay element is configured to generate an output signal with a frequency based on the delay of the delay element, wherein the adjusting voltage and the controllable capacitance are configured to control the frequency of the output signal.

7. The circuit of claim 1, wherein the circuit is an oscillator in a phase-locked-loop, a digital-locked-loop, or a clock and data recovery circuit, and wherein the phase-locked-loop, the digital-locked-loop, or the clock and data recovery circuit is configured to provide the adjusting voltage on the voltage adjust line.

8. A circuit comprising:
    a voltage adjust line configured to provide an adjusting voltage; and
    a plurality of stages coupled to the voltage adjust line and configured to generate an output signal at a frequency, the plurality of stages coupled together such that an output of each of the plurality of stages is coupled to an input of another of the plurality of stages, each of the plurality of stages comprising:
        a delay element having a delay, the delay element being coupled to the voltage adjust line such that the adjusting voltage on the voltage adjust line provides fine-adjusting of the delay of the delay element; and a controllable capacitance coupled to an output of the delay element, wherein a change of the controllable capacitance provides coarse-adjusting of the delay of the delay element, wherein the coarse-adjusting of the delay of the delay element by the controllable capacitance results in discrete delays with a first delay being between two adjacent discrete delays and the fine-adjusting of the delay of the delay element by the adjusting voltage results in a range of delays with a range greater than the first delay, wherein the change of the controllable capacitance is independently adjustable from a change in the adjusting voltage and the frequency of the output signal is based on the delay of the delay elements of the plurality of stages.

9. The circuit of claim 8, wherein the delay elements comprise inverters.

10. The circuit of claim 8, wherein the plurality of stages includes an odd number of stages.

11. The circuit of claim 8, wherein the controllable capacitance in each of the plurality of stages comprises an array of switched capacitors, wherein each of the switched capacitors in the array is individually switched to add capacitance to or remove capacitance from the output of the delay element to thereby coarsely adjust the delay of the delay element.

12. The circuit of claim 8, wherein the circuit is an oscillator in a phase-locked-loop, a digital-locked-loop, or a clock and data recovery circuit, and wherein the phase-locked-loop, the digital-locked-loop, or the clock and data recovery circuit is configured to provide the adjusting voltage on the voltage adjust line.

13. A method of adjusting a frequency of an oscillator, the method comprising:

adjusting a controllable capacitance coupled to an output of a delay element in a stage of a ring oscillator to adjust a delay of the delay element such that a frequency of an output signal of the ring oscillator is adjusted, wherein the controllable capacitance provides coarse-adjusting of the delay of the delay element and the coarse-adjusting of the delay of the delay element results in discrete delays with a first delay being between two adjacent discrete delays; and adjusting an adjusting voltage supplied to the delay element to adjust the delay of the delay element such that the frequency of the output signal is adjusted, wherein the adjusting voltage provides fine-adjusting of the delay of the delay element and the fine-adjusting of the delay of the delay element results in a range of delays with a range greater than the first delay, wherein the controllable capacitance is independently adjustable from an adjustment of the adjusting voltage.

14. The method of claim 13, further comprising selecting a frequency range of operation for the output signal from a plurality of frequency ranges of operation, wherein the controllable capacitance is coarsely adjusted based on the selected frequency range of operation.

15. The method of claim 14, further comprising selecting a particular frequency within the selected frequency range of operation, wherein the adjusting voltage is adjusted based on the particular frequency.

16. The method of claim 13, wherein adjusting the controllable capacitance includes selecting one or more capacitances to couple to the output of the delay element from a switched capacitance array.

17. The method of claim 13, wherein increasing the controllable capacitance increases the delay of the delay element such that the frequency of the output signal decreases.

18. The method of claim 13, wherein increasing the adjusting voltage decreases the delay of the delay element such that the frequency of the output signal increases.

* * * * *